United States Patent [19]
Clark, Jr. et al.

[11] Patent Number: 5,483,232
[45] Date of Patent: Jan. 9, 1996

[54] METHOD AND APPARATUS FOR PREDICTING PEAK VOLTAGE OF A CABLE CONVEYED TOOL

[75] Inventors: Lloyd D. Clark, Jr., Austin; Terry L. Mayhugh, Round Rock; Terry L. Mayhugh, Jr., Austin; Jimmy E. Neeley, Palacios; Guy Vachon, Austin, all of Tex.

[73] Assignee: Schlumberger Technology Corporation, Austin, Tex.

[21] Appl. No.: 285,314

[22] Filed: Aug. 3, 1994

[51] Int. Cl.⁶ ........................................... G01V 1/00
[52] U.S. Cl. .................... 340/853.1; 340/853.2; 324/543; 324/601; 324/691
[58] Field of Search ................ 340/853.1, 853.2, 340/854.9; 324/543, 601, 691

[56] References Cited

U.S. PATENT DOCUMENTS 5,150,064  9/1992  Nozick .......................... 324/691
5,309,294  5/1994  Cahalan ......................... 360/66
5,359,711  10/1994  Hartmann et al. ............... 395/161

Primary Examiner—J. Woodrow Eldred
Attorney, Agent, or Firm—Charles D. Huston

[57] ABSTRACT

A method and apparatus for predicting the peak voltage at the load end of a power transmission cable having a power supply end and a load end, where direct measurement at the load end is not practical. The method samples the current and voltage waveforms at the power supply end of the cable. The current waveform is used to estimate a current function which includes a full width at half maximum approximation adjusted as required for load, cable type, and cable length. The product of the current function and a peak voltage sample from the power supply end is an estimate of the peak voltage at the load end. The method and apparatus have been applied to oil well logging where one or more logging tools are lowered at the end of a transmission cable into an oil well and it is desirable to predict peak voltage at the tools to ensure proper tool performance.

18 Claims, 9 Drawing Sheets

METHOD AND APPARATUS FOR PREDICTING PEAK VOLTAGE OF A CABLE CONVEYED TOOL

BACKGROUND OF THE INVENTION

1. Field of the Invention

This invention relates generally to a method for predicting the peak voltage of a tool or other load at the end of a power transmission cable. In particular, it relates to a method and apparatus for predicting the downhole peak voltage of a wireline tool or tool combination.

2. Description of Related Art

In wireline oil well logging, a number of tools are connected to a power and data transmission cable and lowered into the oil well borehole to obtain measurements of the geophysical properties of the area surrounding the borehole. Well-logging is the measurement of characteristics of different earth formations traversed by a borehole, usually an oil or gas well using one or more measuring instruments or tools. The tools are typically stacked in a tool string, the tool string being attached to a logging cable which supports the tool string, provides power to the tool or tools and provides a communication medium for the transmission of data from the tool or tools to data acquisition and processing equipment on the surface.

Downhole tools receive their power through the transmission cable. An AC power supply is connected on the surface to one end of the cable and the tools are connected to the other end of the cable for conveyance into and out of the borehole (see FIG. 1). FIG. 3 shows schematically how the tools are connected electrically to the uphole power supply. FIG. 4 shows in more detail that each tool rectifies the incoming AC voltage used by the tool to produce a tool DC voltage. For each tool to perform as designed, the tool needs to have its DC voltage $V_{dc}$ (as shown in FIG. 4) within a specified range. To obtain the specified range for $V_{dc}$ requires that the peak amplitude of the AC waveform downhole, $V_{acdh}$, (FIG. 4) must also be within a specified range. As shown in FIG. 4, $V_{acdh}$ in turn depends upon the uphole AC voltage $V_{acuh}$ and the losses on the cable. For the tools to operate properly it is important that the operator be able to set $V_{acdh}$ very accurately. Setting $V_{acdh}$ too low prevents the tool from working as designed. Setting $V_{acdh}$ too high can, in fact, damage the tool.

The difficulty with the waveforms in FIGS. 3 and 4 is that the current waveforms are distorted. The load is time varying and non-linear. The current is only drawn at the peaks of the AC power waveform when the input voltage exceeds the voltage level stored by the capacitor. During conduction, current flows across the high impedance power path causing clipping of the power voltage waveform seen by the tools. The impedance of the high impedance power path and the amount of power supply load and capacitance varies for different tools and cable types and cable lengths. $V_{dc}$ in FIG. 4 is proportional to the peak value of $V_{acdh}$. There is a real need to predict the value of the load's peak voltage waveform remotely from the power driving end in order to apply power without destroying the load.

Currently, oilfield logging engineers go through a procedure in which they temporarily short out the end of the power path, apply some power and then zero out the uphole voltage meter to compensate for the cable impedance. This procedure is called power trim. Since this driving circuitry has no knowledge of the amount of clipping that will occur at the load end of the power path when an actual toolstring is connected, it does not compensate for this time varying load. It compensates as if the load were time invariant.

In other words, this is based on the assumption that $$V_{acdh} = V_{acuh} - (I_{wire} \cdot R_{wire})$$

The cable power trim measures $R_{wire}$. The circuitry that monitors power at the surface estimates the downhole voltage by first making an RMS measurement then subtracting from it ($I_{wire} \cdot R_{wire}$). This technique works if sinusoidal waveforms and time invariant loads are assumed. It yields worst case errors of about 30% when these assumptions fail.

The problem with this and other conventional metrics for quantifying sinusoidal voltages or currents are based upon moment calculations (i.e. average, RMS, or mean square). These moments are adequate if the shape of the waveform is well known and consistent (i.e. sinusoidal) because moment calculations are based on the area of the waveform. For these well-behaved waveforms the moment measured can be scaled to yield the measurement we actually want which is the peak value of the waveform. In the wireline logging application the waveforms are distorted, the shapes of the quantity being measured are basically unknown and so the moments cannot be calculated. Scaling a measurement based on these assumptions has proven to be only accurate to ±30%.

Another problem that exists in the power trim method is that the measured cable resistance changes as the cable is lowered into the well and heated. This causes a measurement error to occur.

Applications other than wireline logging exist where it is desirable to predict voltage or the power consumption of a load at the end of a transmission cable where direct measurement is not feasible.

SUMMARY OF THE INVENTION

The problems outlined above with current methods for predicting downhole tool peak voltage are largely solved by the method and apparatus of the present invention. The method hereof predicts the peak downhole voltage compensating for non-sinusoidal waveforms and time variant loads. The method approximates the width of the uphole current pulse, measures a peak uphole voltage, and determines a corresponding peak downhole voltage. By determining peak downhole voltage, the operator is able to adjust the power supply to obtain optimum tool and tool combination performance without damage to any of the tools. While the method and apparatus of the method of the present invention is particularly applied to wireline logging, it is equally applicable to other applications where it is important to control or predict the power or voltage characteristics of a load at the end of a transmission cable remote from a power supply.

Generally speaking, the method of the present invention for predicting peak voltage contemplates a transmission cable coupled to an AC power supply where it is desirable to predict the peak voltage at the remote end. The method samples the current and voltage of the AC waveform at the power supply end of the cable to obtain a plurality of current and voltage samples defining respective current and voltage waveforms. A pulse width function of the power supply current waveform is approximated with the leading and trailing edges clipped to eliminate distortions, asymmetries, and noise. The remote end peak voltage is predicted by multiplying the current pulse width function by a power supply peak voltage sample. Preferably, the pulse width function is adjusted for the load at the end of the cable, the length of the cable, and the type of the cable. In a preferred form, the pulse width function is an estimate of the width at around half maximum of the current waveform where the leading and trailing edges are clipped preferably below 80% of peak current and below 25% respectively.

In a wireline oil well logging system application the apparatus of the present invention predicts peak downhole voltage based on the current and voltage uphole waveforms. The apparatus samples the uphole voltage and the uphole current, and also includes a processor which utilizes the current and voltage samples. The processor determines a current pulse width function based on the uphole current samples, determines a peak uphole voltage value from the uphole voltage samples, and predicts the peak downhole voltage as the product of the uphole voltage and the current pulse width function. Preferably, the pulse width approximation comprises the full width at half maximum of the uphole current waveform with the leading and trailing edges clipped.

DESCRIPTION OF THE PREFERRED EMBODIMENT

Figure 1:
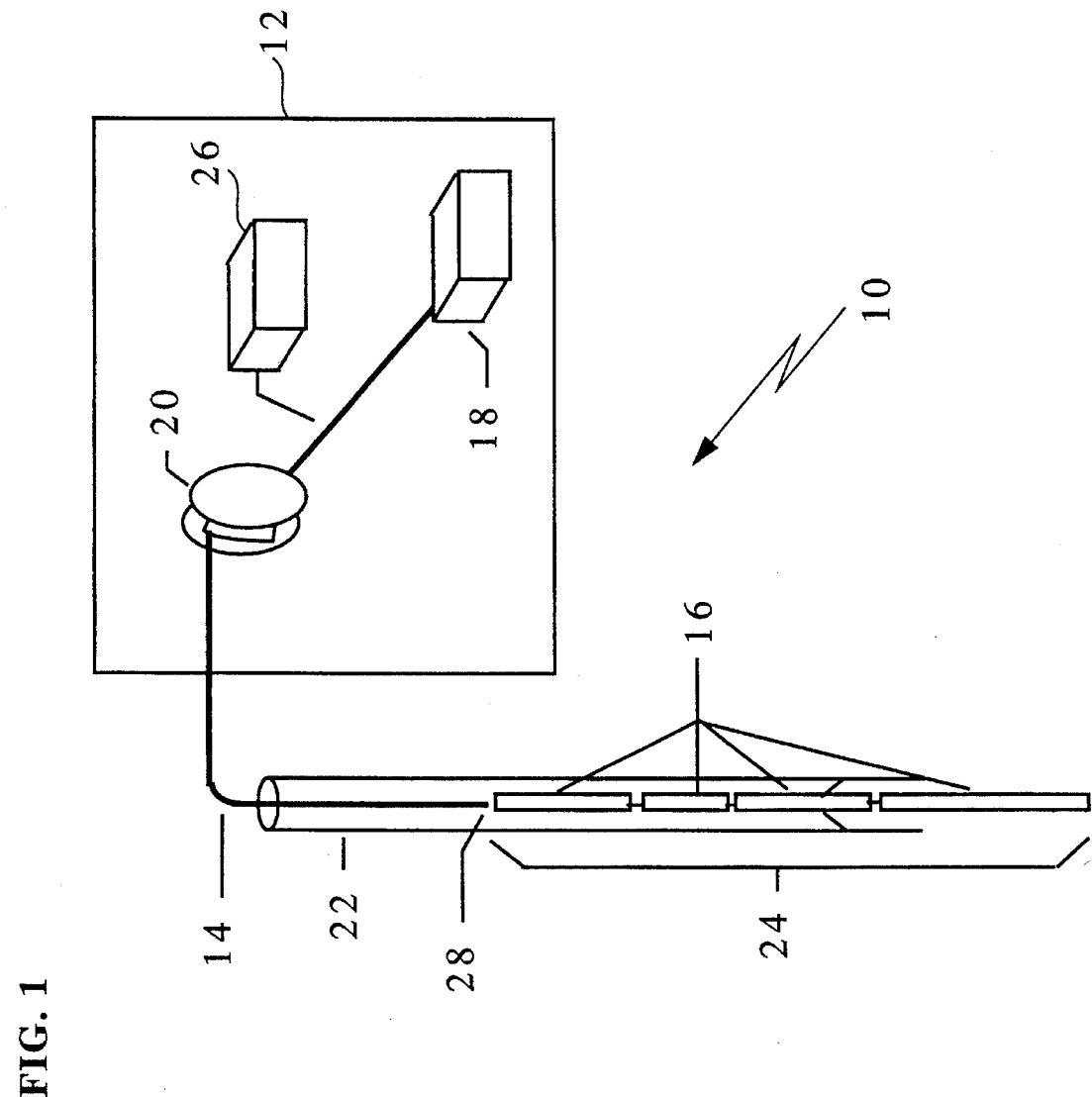
FIG. 1 is a schematic showing the apparatus of the current invention in the context of an oilwell logging system.

Turning now to the drawings, FIG. 1 shows a schematic of an oil well logging system 10 which includes an acquisition system 12, cable 14, and one or more tools 16. The acquisition system 12 includes an AC tool power supply 18 which supplies AC power over the cable 14 to the tool 16. The cable 14 circumvolutes a reel 20 before entering a borehole 22. Typically, the tools 16 are preassembled before lowering in the borehole 22 into a combination or tool string 24. The prediction apparatus 26 of the present invention is preferably coupled to the cable 14 preferably between the AC power supply 18 and reel 20. The prediction apparatus 26 samples voltage and current passed over the cable 14 from the power supply 18. Of importance to the present invention is determining the voltage at the head 28 of the tool string 24.

Figure 2:
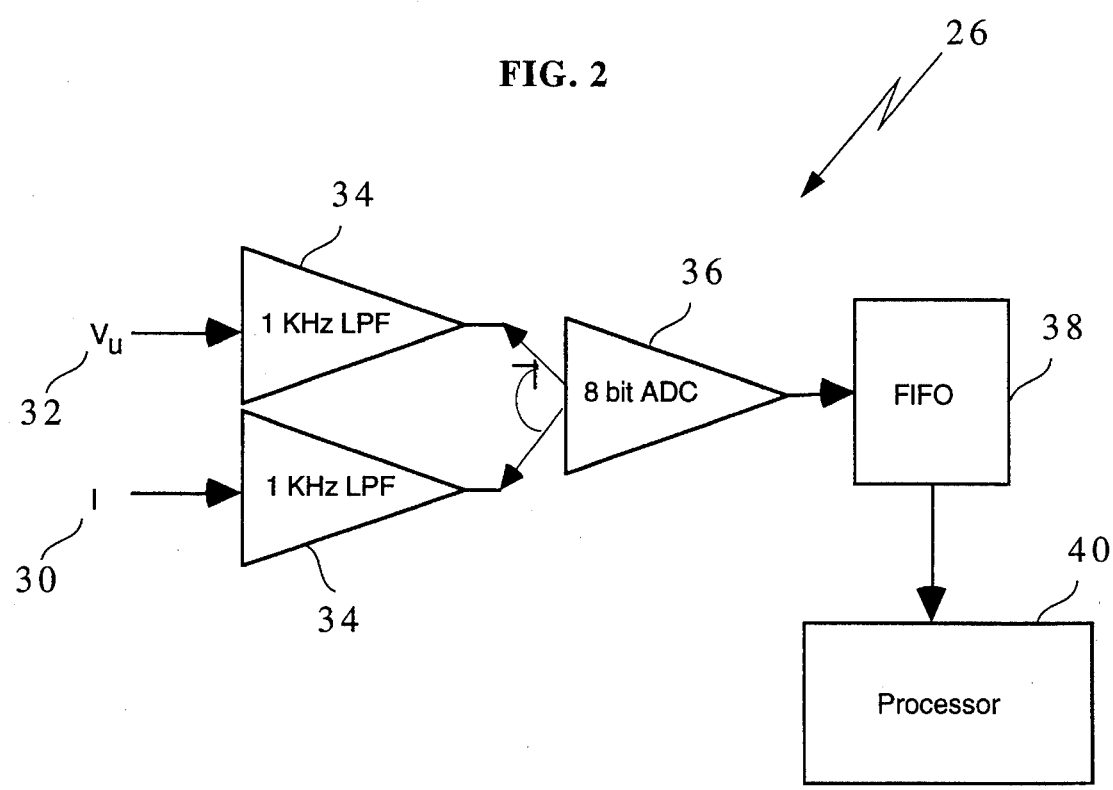
FIG. 2 is a schematic showing the apparatus of the preferred embodiment in more detail.
Figure 3:
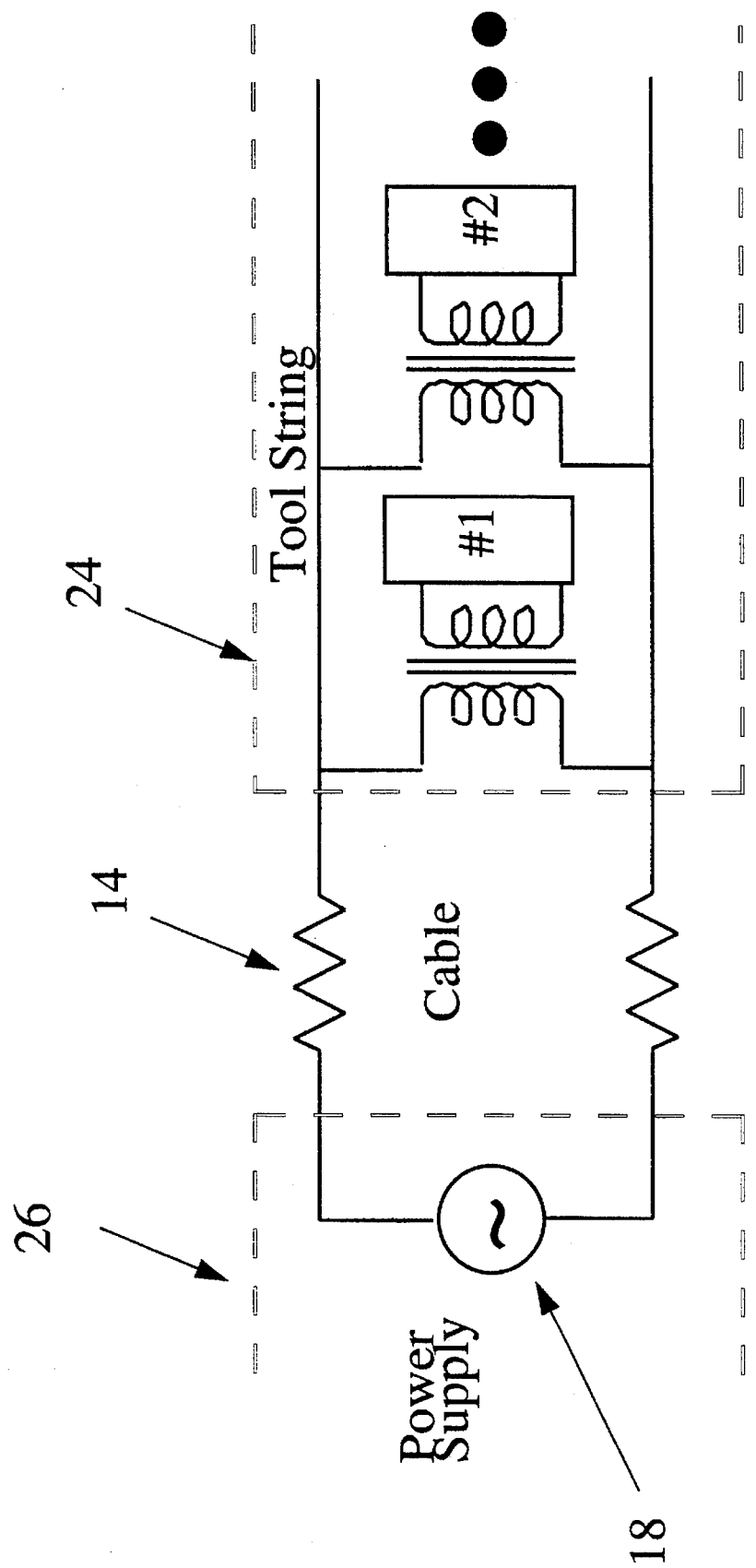
FIG. 3 is an electrical schematic illustrating the tool relationship to the power supply and cable resistance.

Turning to FIG. 2, the prediction apparatus 26 is illustrated in more detail. As can be seen from FIG. 2, the prediction apparatus 26 includes an analog front-end that samples the current and voltage as at 30, 32. To eliminate the effects of various random high frequency noise sources, a pair of 1 KHz low-pass filters 34 are used to receive the current and voltage samples 30, 32. Preferably the low-pass filters 34 eliminate the noise without eliminating important spectral content of the current and voltage samples. The current and voltage samples 30, 32 are then passed then to an 8-bit A to D converter with the digital values fed to a FIFO buffer 38. A processor 40 reads the buffer to perform the computations required to estimate the downhole voltage.

The sampling rate at 30, 32 affects the accuracy of measurements and therefore a high sampling rate is desirable. The preferred embodiment uses a 6 KHz sample rate for 60 Hz waveforms, resulting in an ultimate quantization error of approximately (±) 5%. The resolution of the A to D converter 36 also affects the accuracy, but 8-bit appears to be sufficient to make the A/D converter quantization error negligible with respect to the quantization error introduced by the sampling rate. The processor 40 operates often enough to give the effect that the downhole voltage is continuously predicted. In the embodiment of FIG. 2, the update rate is approximately 10 Hz.

Figure 4:
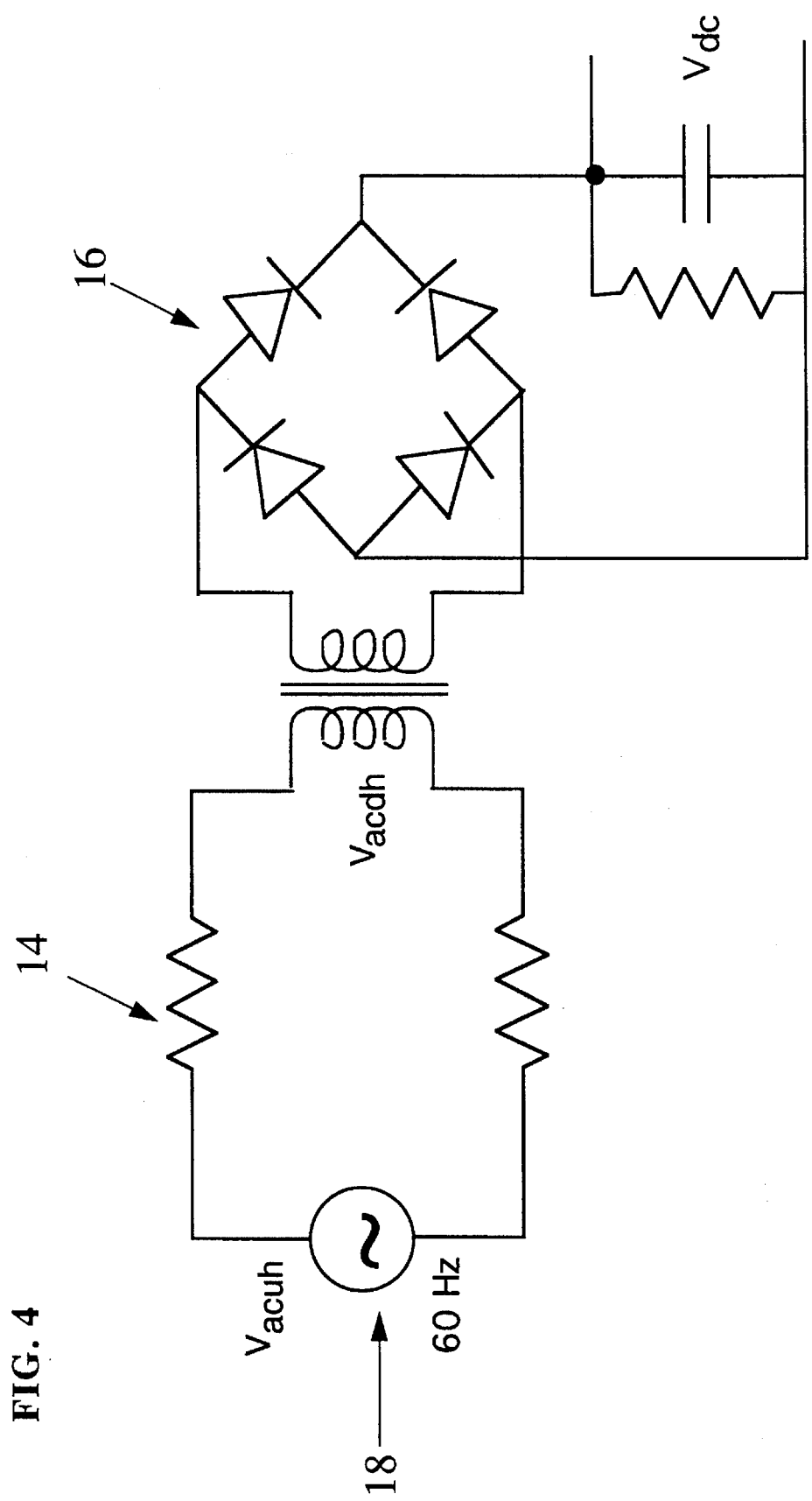
FIG. 4 is an electrical schematic similar to FIG. 3 illustrating tool full wave rectifications to generate the desired downhole $V_{dc}$ voltage.

As previously indicated, for the tools 16 to operate properly, the DC voltage ($V_{dc}$) must lie within a specified range (see FIG. 4). As shown in FIG. 4, the downhole DC voltage ($V_{dc}$) is dependent upon the downhole AC voltage ($V_{acdh}$) which in turn is dependent upon uphole voltage ($V_{acuh}$) at the power supply 18. As can be appreciated from FIG. 4, losses on the cable 14 are also a factor on controlling the $V_{dc}$ which is of course dependent upon cable length and type.

If some simplifying assumptions are made, it is possible to derive a functional relationship between uphole voltage, downhole voltage, and the duration of uphole current pulses. Turning to FIG. 4, assume that the downhole voltage on the right side of the rectifying bridge is a perfect dc voltage with no ripple, labeled $V_{dc}$. If this is true and the bridge is ideal, then uphole current will flow only when the instantaneous value of the uphole voltage is greater than $V_{dc}$. If we attribute all differences between the uphole and the downhole voltage to IR drop on the cable 14, there will be no drop until the bridge begins to conduct so the voltage downhole will be the same as the voltage uphole until that point. Such a waveform is illustrated in FIG. 5 where the uphole current waveform is labeled 50, the uphole voltage waveform is labeled 52, and the downhole dc voltage is labeled 54.

Figure 5:
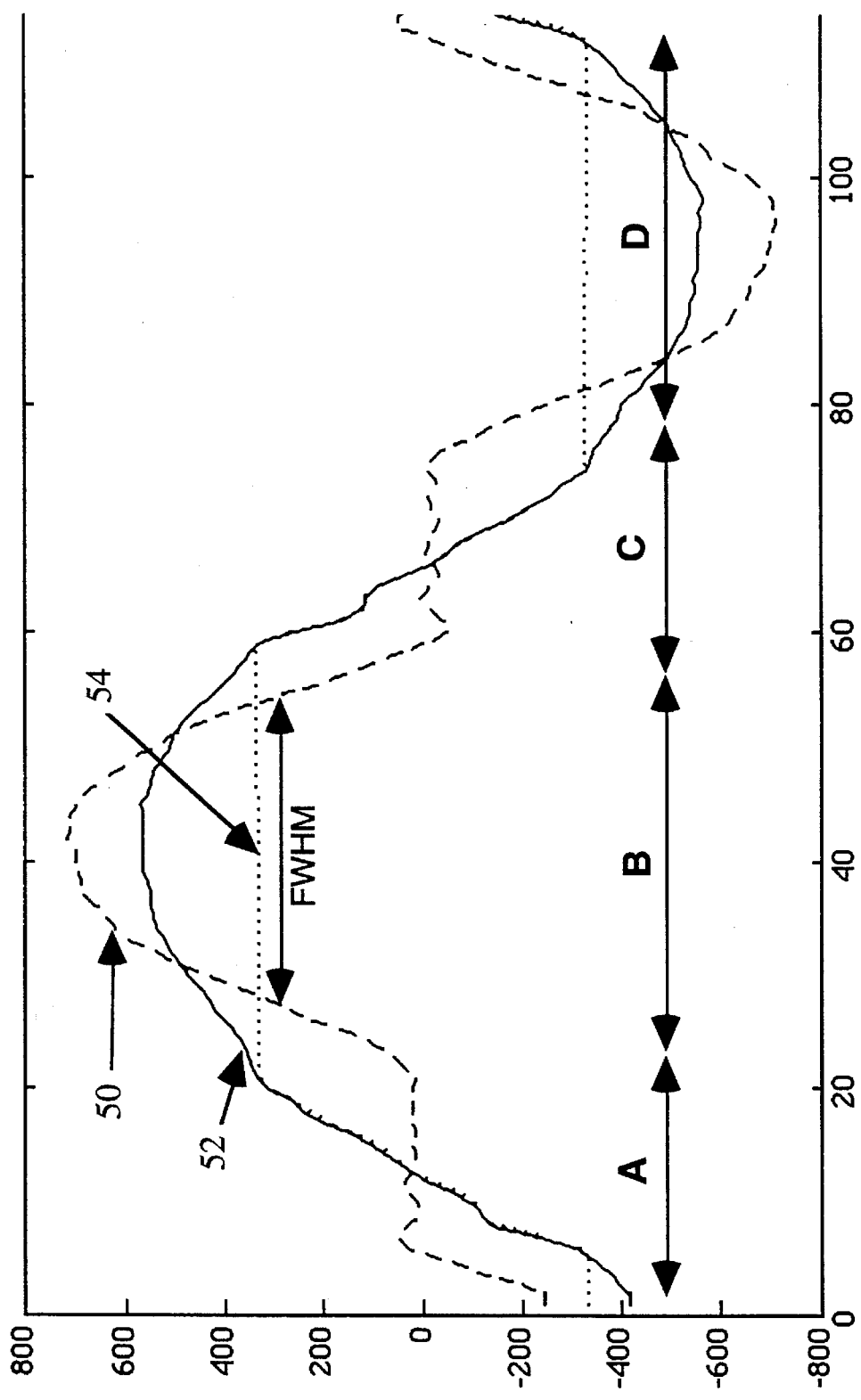
FIG. 5 is a graph showing uphole current waveforms and uphole voltage waveforms plotting amplitude versus time.
Figure 6:
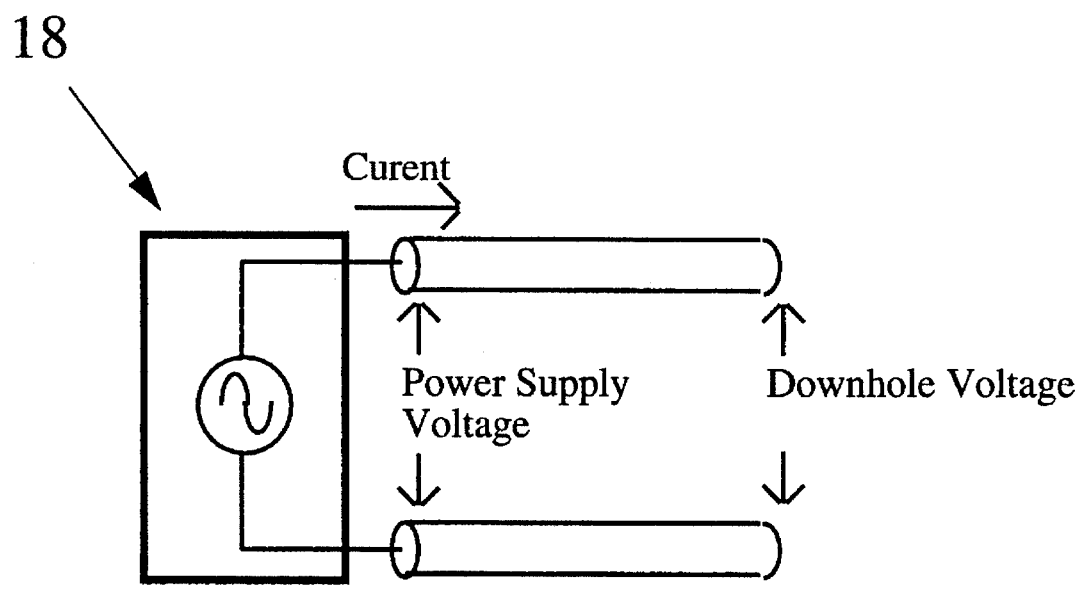
FIG. 6 is an electrical schematic illustrating circuit equivalents before and after conduction.
Figure 7:
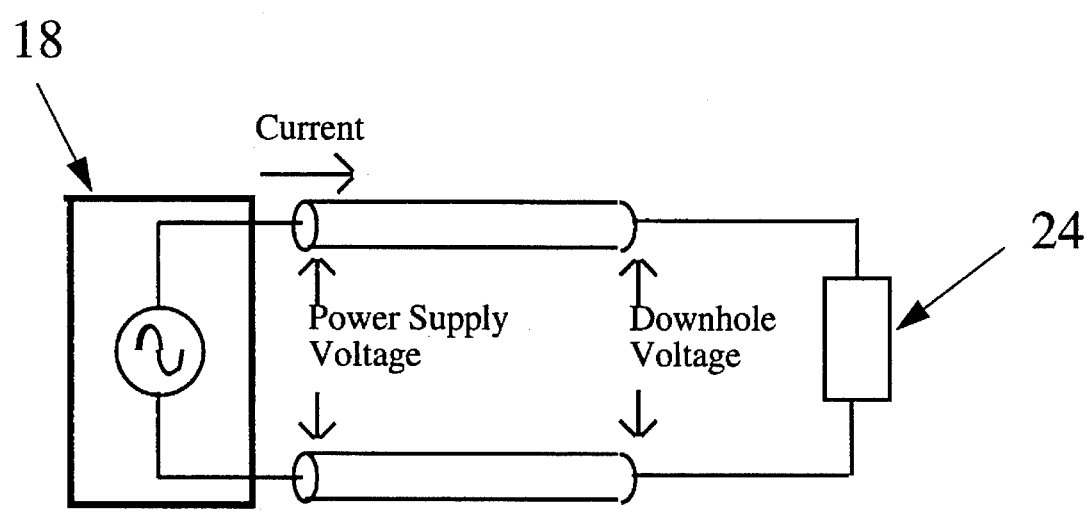
FIG. 7 is a circuit diagram depicting the effective circuit during conduction.

Because the circuit illustrated in FIG. 4 is actually time varying, during the time given by regions A and C of FIG. 5, the circuit appears as depicted in FIG. 6. During the time given by regions B and D of FIG. 5, the circuit appears as illustrated in FIG. 7.

As an explanatory example, assume that there is no drop across the cable 14 until current begins to flow so until then $V_{uphole} = V_{downhole}$ but after current flows, $V_{downhole}$ remains flat as shown in FIG. 5. If $V_{uphole}$ is measured at the time current begins to flow and it is assumed to be equal to $V_{downhole\ peak}$, a good estimate of the downhole peak voltage can be made. Transmission line effects on the cable 14 and various second order rectifier and load effects make it difficult to tell precisely when current begins to flow, and asymmetries in the waveforms render this impractical, but it illustrates one way to relate $V_{uphole}$ and the time when current flows to $V_{downhole\ peak}$.

As another explanatory example, assume a cosine form for the uphole voltage waveform $V_{dc}$ is constant. The times at which the uphole current will turn on or off will be times t such that $$V_d = V_u \cdot \cos(2\pi f t) \qquad \text{Equation 1}$$

where $V_u$ is the peak uphole voltage and f is the frequency. If Equation 1 is rearranged to solve for the duration of an uphole current pulse t, the following equation is obtained:

$$t = \frac{1}{\pi f} \times \arccos\left(\frac{V_d}{V_u}\right) \quad \text{Equation 2}$$

Equation 2 implies that the duration of an uphole current pulse t is a direct function of the ratio of the uphole voltage and downhole voltage. It also implies that, knowing only the duration of an uphole current pulse (or something related to it, such as its Full Width at Half Maximum—FWHM, see FIG. 5) and the uphole voltage, it should be possible to solve this equation for the downhole voltage if the given assumptions hold true.

In reality, it is not possible to accurately compute the relation between t and $V_d/V_u$ using equations 1 and 2. The power waveform is distorted to where it is not a sinusoid. The resulting current waveform is dominated by higher frequency components. It is also asymmetrical. Instead, the preferred embodiment of the present invention uses a linear approximation to the function of equation 2 which yields results far better than the prior art.

The general approximation is:

$$\frac{V_d}{V_u} = (m \times FWHM + y) \text{ or } V_d = V_u \times (m \times FWHM + y)$$

Figure 8:
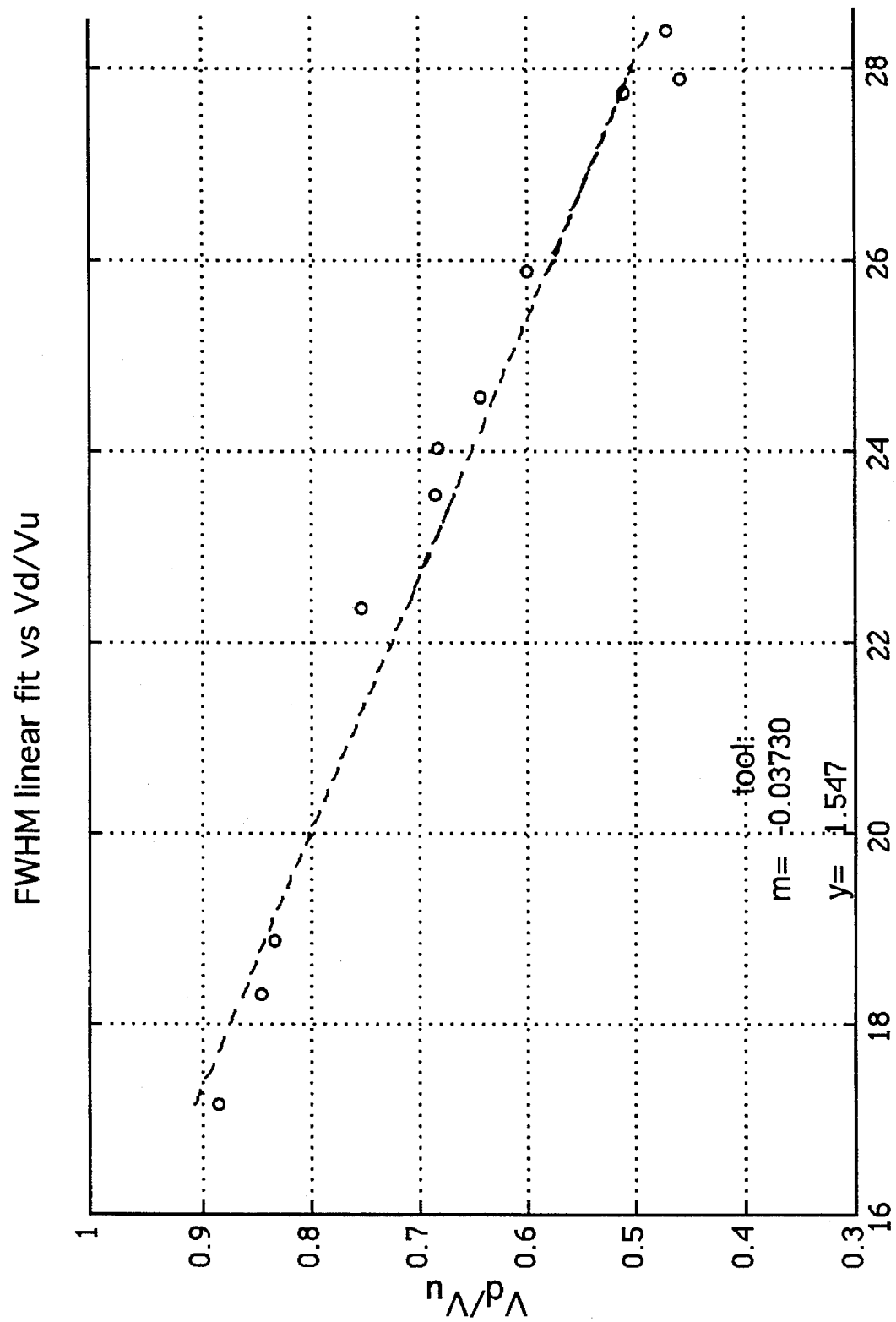
FIG. 8 is a graph plotting the use of $V_d/V_u$ against full width at half maximum (FWHM) measurements.

In order to compute m & y, measurements were made to determine the uphole voltage, downhole voltage, and current for a variety of tool combinations, cable types and cable lengths. A linear regression was used to compute m and y for the line that best fit the data points; the results are illustrated in FIG. 8.

Figure 9:
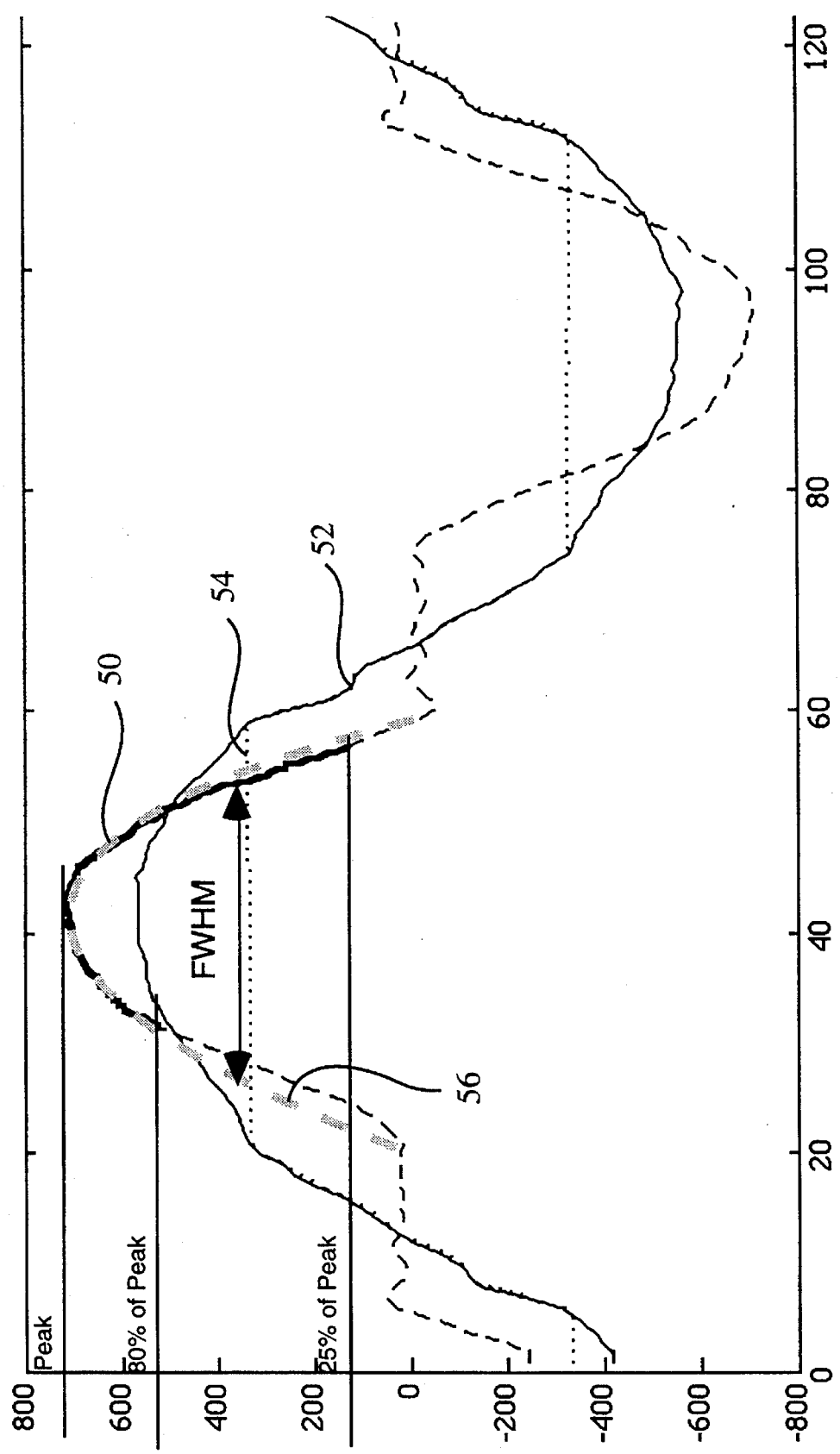
FIG. 9 is a graph similar to FIG. 5 illustrating clipping regions of the leading and trailing edge current uphole waveform to approximate the full width at half maximum (FWHM).

Accurate computation of the FWHM is difficult as one can see from FIG. 5 because the current waveform 50 is noisy and asymmetrical. The majority of the asymmetries affect the leading edge of each current pulse. FIG. 9 illustrates the approach of the preferred embodiment to increase accuracy of the FWHM estimate. In order to eliminate the effect of the asymmetries in the FWHM measurement, the points on the current waveform 50 that lie between the 80% point and the 25% point are fitted with a second order polynomial with a linear regression as illustrated by curve 56. The equation of the resulting curve 56 is solved for the FWHM. An alternative embodiment which is less computationally intensive though potentially less accurate is to estimate FWHM by measuring the time interval from 65% of max before current peak to 65% of peak after peak.

We claim:

1. A method for predicting the peak voltage at the load end of a transmission cable, the cable having a load end and a power supply end, comprising the steps of:
   sampling the current and voltage of an AC waveform proximate the supply end of the cable to obtain a plurality of current and voltage samples representing respective current and voltage waveforms;
   approximating a current pulse width function of said current waveform at the cable power supply end, where the leading edge of said current waveform at the power supply end is clipped and a second curve fit to approximate said current pulse width function; and
   predicting an approximate remote end peak voltage by multiplying a peak voltage sample by the current pulse width function.

2. The method of claim 1, the pulse width function being adjusted for the load at the end of the cable.

3. The method of claim 1, the pulse width function being adjusted for the length and type of cable.

4. The method of claim 1, said pulse width function comprising a full width at half maximum (FWHM) approximation of said clipped current waveform.

5. The method of claim 1, the FWHM being approximated where the leading edge of said current waveform is clipped between 0 and 80% of peak.

6. The method of claim 1, the FWHM being approximated where the trailing edge of said current waveform is clipped between 25% and 0 of peak.

7. The method of claim 1, said sampling step including sampling the AC waveform in an AC power supply connected to the power supply end.

8. The method of claim 1, the cable comprising a wireline logging cable with a load coupled to the load end, the load comprising one or more wireline logging tools.

9. The method of claim 1, said sampling step including measuring the analog current and voltage at about a 6 KHz sampling rate and converting the samples to digital values.

10. An apparatus for predicting the peak downhole voltage of a wireline oil well logging system having an uphole power supply, a wireline cable, and one or more tools attachable to the cable for lowering into an oil well borehole, comprising:
    means for sampling the uphole voltage proximate the power supply to obtain a plurality of uphole voltage samples;
    means for sampling the uphole current proximate the power supply to obtain a plurality of uphole current samples; and
    processor means connected to the current and voltage sampling means for
       determining a current pulse width function based on the uphole current samples,
       determining a peak uphole voltage value from the uphole voltage samples,
       predicting the peak downhole voltage as a function of the peak uphole voltage and the current pulse width function.

11. The method of claim 10, said current pulse width function comprising a full width at half maximum (FWHM) approximation of a current waveform represented by said uphole current samples.

12. The method of claim 11, said current waveform having a clipped leading and trailing edge to estimate said FWHM.

13. The method of claim 10, said current and voltage sampling means comprising an analog to digital converter for receiving analog current and voltage samples, for converting the analog samples to digital values, and for sending said digital values to said processor.

14. The method of claim 13, said sampling means including low pass filters operatively coupled to said cable adjacent said power supply.

15. In a wireline oil well logging system having an uphole AC power supply, a wireline cable having uphole and downhole ends with the uphole end connected to the uphole power supply, and one or more tools connectable to the downhole end of the cable for conveyance into an oil well borehole, a method for predicting the peak voltage at the downhole end of the cable comprising the steps of:
    sampling the current and voltage waveforms on the cable proximate the uphole cable end to obtain a plurality of uphole current and voltage samples;
    determining a current function where the current function is based on a pulse width approximation of the current waveform derived from the uphole current samples and adjustment functions dependent on types of tools connected to the cable downhole end; and predicting the downhole peak voltage as the product of the uphole peak voltage and the current function.

16. The method of claim 15, the adjustment function being additionally dependent on type and length of cable.

17. The method of claim 15, including the step of determining the pulse width approximation by estimating the uphole current waveform from said uphole current samples and clipping the leading and trailing edges of the uphole current waveform to obtain a clipped uphole current waveform.

18. The method of claim 17, the pulse width approximation comprising the full width at half maximum (FWHM) of the clipped uphole current waveform with the leading edge clipped between 0 and 80% of peak current and the trailing edge clipped between 80% and 0 of peak current.

* * * * *

UNITED STATES PATENT AND TRADEMARK OFFICE
CERTIFICATE OF CORRECTION

PATENT NO. : 5,483,232
DATED : January 9, 1996
INVENTOR(S) : Clark, Jr. et al

It is certified that error appears in the above-identified patent and that said Letters Patent is hereby corrected as shown below:

In Claim 11, Column, 6, line 1, change "method" to --apparatus--.

In Claim 12, Column, 6, line 1, change "method" to --apparatus--.

In Claim 13, Column, 6, line 1, change "method" to --apparatus--.

In Claim 14, Column, 6, line 1, change "method" to --apparatus--.

Signed and Sealed this

Twenty-sixth Day of November 1996

Attest:

BRUCE LEHMAN

*Attesting Officer*            Commissioner of Patents and Trademarks